(12) United States Patent
Chen et al.

(10) Patent No.: US 11,450,359 B1
(45) Date of Patent: Sep. 20, 2022

(54) MEMORY WRITE METHODS AND CIRCUITS

(71) Applicant: QUALCOMM Incorporated, San Diego, CA (US)

(72) Inventors: Xiao Chen, San Diego, CA (US); Po-Hung Chen, Los Angeles, CA (US); Chen-ju Hsieh, Campbell, CA (US); David Li, San Diego, CA (US); Chulmin Jung, San Diego, CA (US); Ayan Paul, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/366,864

(22) Filed: Jul. 2, 2021

(51) Int. Cl.
*G11C 7/10* (2006.01)
*G11C 7/12* (2006.01)
*H03K 19/173* (2006.01)
*G11C 5/14* (2006.01)
*H03K 19/0185* (2006.01)

(52) U.S. Cl.
CPC ............. *G11C 7/1009* (2013.01); *G11C 5/14* (2013.01); *G11C 7/1045* (2013.01); *G11C 7/1069* (2013.01); *G11C 7/1096* (2013.01); *G11C 7/12* (2013.01); *H03K 19/018521* (2013.01); *H03K 19/1737* (2013.01)

(58) Field of Classification Search
CPC ...... G11C 7/10; G11C 7/1009; G11C 14/0054
See application file for complete search history.

(56) References Cited

U.S. PATENT DOCUMENTS

| | | | |
|---|---|---|---|
| 6,337,822 B1 | 1/2002 | Kwak et al. | |
| 10,147,483 B1 | 12/2018 | Mohanty et al. | |
| 10,325,648 B2 | 6/2019 | Mehta et al. | |
| 2015/0043270 A1 | 2/2015 | Singh et al. | |
| 2015/0109865 A1* | 4/2015 | Gulati | G11C 7/12 365/189.02 |
| 2020/0005877 A1 | 1/2020 | Arora et al. | |
| 2020/0043554 A1* | 2/2020 | Moriwaki | G11C 15/04 |
| 2020/0090736 A1* | 3/2020 | Schaefer | G11C 5/145 |

* cited by examiner

*Primary Examiner* — Han Yang
(74) *Attorney, Agent, or Firm* — Haynes and Boone, LLP

(57) ABSTRACT

Various implementations provide systems and methods for writing data to memory bit cells. An example implementation includes a write circuit that couples both a bitline and a complementary bitline to power (VDD) by positive-channel metal oxide semiconductor (PMOS) transistors. By using PMOS transistors instead of NMOS transistors at the applicable nodes, such implementations may avoid a voltage drop between VDD and the bitlines, thereby allowing the bitlines to reach a substantially full VDD voltage level when appropriate. Additionally, various implementations avoid dynamic nodes that share charge across NMOS transistors, thereby allowing a given bitline to reach a substantially full VDD voltage level when appropriate. Accordingly, some implementations may experience higher levels of writability and static noise margin than other implementations.

21 Claims, 9 Drawing Sheets

MEMORY WRITE METHODS AND CIRCUITS

TECHNICAL FIELD

The present application relates, generally, to memory write circuits and, more specifically, to memory write circuits that enhance stability and writability.

BACKGROUND

An example memory may include a multitude of memory bit cells arranged in columns, with the bit cells in a given column sharing bitlines. The bitlines may be driven by memory write circuits. Static noise margin (NM) is a concern in some write circuits as devices get smaller. Bit cell stability and writability are two different issues but both may experience degradation due to process variation. Memory stability feels the effect of NM, and writability feels the effect of write margin. Stability and writability may affect yield.

Accordingly, there is a need in the art for techniques for writing data to bit cells that increases both NM and writability.

SUMMARY

Various implementations provide systems and methods for writing data to memory bit cells. An example implementation includes a write circuit that couples both a bitline and a complementary bitline to power supply (VDD) by positive-channel metal oxide semiconductor (PMOS) transistors. By using PMOS transistors instead of NMOS transistors at the applicable nodes, such implementations may avoid a voltage drop between VDD and the bitlines, thereby allowing the bitlines to reach a full VDD voltage level when appropriate. Additionally, various implementations may avoid dynamic nodes that share charge across NMOS transistors, thereby allowing a given bitline to reach a full VDD voltage level when appropriate. Accordingly, some implementations may experience higher levels of writability and static noise margin than other implementations.

According to one implementation, A static random-access memory (SRAM) write circuit includes: a first NMOS transistor coupled in series with a first PMOS transistor, the first NMOS transistor being coupled to ground, and the first PMOS transistor being coupled to a power supply (VDD); a second NMOS transistor coupled in series with a second PMOS transistor, the second NMOS transistor being coupled to ground, and the second PMOS transistor being coupled to the VDD; a first bitline coupled to a first node between the first NMOS transistor and the first PMOS transistor; a second bitline coupled to a second node between the second NMOS transistor and the second PMOS transistor; a first logic circuit configured to provide a first control signal to a gate of the first NMOS transistor, the first logic circuit having a first input configured to receive a signal derived from a data signal and a second input configured to receive a write enable signal; and a second logic circuit configured to provide a second control signal to a gate of the second NMOS transistor, the second logic circuit having a third input configured to receive a signal derived from a complementary data signal and a fourth input configured to receive the write enable signal.

According to one implementation, a method of operating a semiconductor device includes: writing a bit to a memory cell, including: turning on a first PMOS transistor, wherein the first PMOS transistor is coupled in series with a first NMOS transistor, wherein turning on the first PMOS transistor couples a first bitline to a voltage level of a power supply (VDD); turning off the first NMOS transistor, wherein the first NMOS transistor is controlled by a first logic circuit providing a first control signal to a gate of the first NMOS transistor, the first logic circuit having a first input configured to receive a signal derived from a data signal and a second input configured to receive an enable signal, wherein turning off the first NMOS transistor isolates the first bitline from ground; turning off a second PMOS transistor that is coupled in series with a second NMOS transistor, including isolating a second bitline from the VDD; and turning on a second NMOS transistor, wherein the second NMOS transistor is controlled by a second logic circuit providing a second control signal to a gate of the second NMOS transistor, the second logic circuit having a third input configured to receive a signal derived from a complementary data signal and a fourth input configured to receive the enable signal, wherein turning on the second NMOS transistor couples the second bitline to ground.

According to one implementation, an apparatus includes: a memory array having a plurality of memory cells arranged in a plurality of columns; and a plurality of write driver circuits coupled to the plurality of columns, wherein a first one of the write driver circuits includes: a first bitline and a second bitline coupled to a first one of the columns; a first NMOS transistor coupled in series with a first PMOS transistor, the first NMOS transistor being coupled to ground, and the first PMOS transistor being coupled to a power supply (VDD), wherein the first bitline is coupled to both the first NMOS transistor and the first PMOS transistor; a first logic circuit configured to provide a first control signal to a gate of the first NMOS transistor, the first logic circuit having a first input configured to receive a signal derived from a data signal and a second input configured to receive an enable signal; a second NMOS transistor coupled in series with a second PMOS transistor, the second NMOS transistor being coupled to ground, and the second PMOS transistor being coupled to the VDD, wherein the second bitline is coupled to both the second NMOS transistor and the second PMOS transistor; and a second logic circuit configured to provide a second control signal to a gate of the second NMOS transistor, the second logic circuit having a third input configured to receive a signal derived from a complementary data signal and a fourth input configured to receive the enable signal.

According to one implementation, a system on chip (SOC) includes: a memory array having a plurality of memory cells arranged in a plurality of columns; and a plurality of write driver circuits coupled to the plurality of columns, wherein a first one of the write driver circuits includes: a first bitline and a second bitline coupled to a first one of the columns; a first NMOS transistor coupled in series with a first PMOS transistor, the first NMOS transistor being coupled to ground, and the first PMOS transistor being coupled to a power supply (VDD), wherein the first bitline is coupled to both the first NMOS transistor and the first PMOS transistor; means for providing a first control signal to a gate of the first NMOS transistor according to a signal derived from a data signal and an enable signal; a second NMOS transistor coupled in series with a second PMOS transistor, the second NMOS transistor being coupled to ground, and the second PMOS transistor being coupled to the VDD, wherein the second bitline is coupled to both the second NMOS transistor and the second PMOS transistor; and means for providing a second control signal to a gate of the second NMOS transistor according to a signal derived from a complementary data signal and the enable signal.

DETAILED DESCRIPTION

Figure 1:
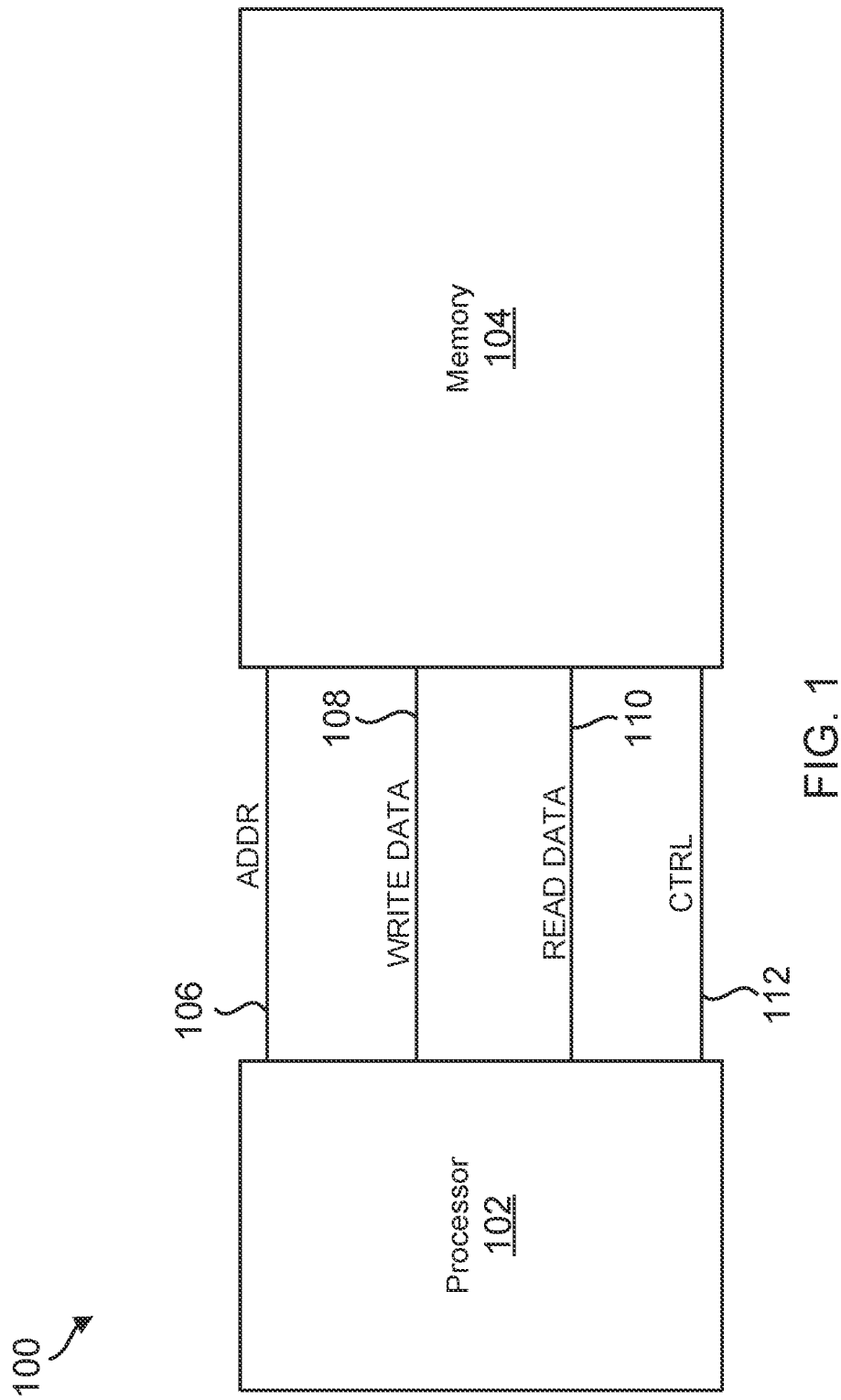
FIG. 1 is a conceptual block diagram illustrating an example of a processing system, according to one implementation.

An example write circuit may couple a bitline to power supply (VDD) through a negative-channel metal oxide semiconductor (NMOS) transistor. During a write operation, if one of the bitlines is set to digital 0, the complementary bitline is not quite at digital 1 because of the voltage drop over the NMOS transistor. This phenomenon may decrease the write margin.

In another example, the write circuit may be used to perform a write masking operation. For instance, a write masking operation may include preventing a value from being written to a memory cell. In this example, the write circuit may apply a digital 1 to both the bitline and the complementary bitline. However, actively driving both bitlines high may stress the bitcell and reduce static noise margin (NM) of the bitcell. In a scenario in which the circuit is affected by process variation, the process variation plus the limited static noise margin may cause a higher probability of flipping a value, which may result in a lower yield.

Another way to perform masking is to allow the bitlines to float, which may increase the NM compared with the scenario discussed above in which both bitlines are driven high. In this example, floating includes isolating a given bitline from both VDD and ground. However, some example write circuits may include a dynamic node coupled between the bitlines and ground, which may result in charge sharing across an NMOS transistor. For instance, in an example write circuit that couples a given bitline to VDD by a first NMOS transistor and couples the same given bitline to ground by a second NMOS transistor, the bitline may be caused to float by turning off both NMOS transistors. However, a node between the transistors may act as a dynamic node, which may have some capacitance.

In an instance in which the node holds onto a previous charge of ground, and the subsequent state includes putting the bitline in a digital 1 state, the previous charge of the node may cause the bitline to be discharged to ground instead of staying at VDD. Such scenario may cause a false write polarity into the bitcell.

Various implementations provided herein include systems and methods for writing data to memory cells within a memory array. One example includes a static random-access memory (SRAM) write circuit that has a first negative-channel metal oxide semiconductor (NMOS) transistor coupled in series with a first positive-channel metal oxide semiconductor (PMOS) transistor. In this example, the first NMOS transistor may be coupled to ground, and the first PMOS transistor may be coupled to a power supply (VDD). A first bitline may be coupled to a node between the first NMOS transistor and the first PMOS transistor, thereby allowing the first bitline to be pulled up to a voltage level of VDD or pulled down to a ground voltage level.

Continuing with the example, the SRAM write circuit may also include a second NMOS transistor coupled in series with a second PMOS transistor. The second NMOS transistor may be coupled to ground, and the second PMOS transistor may be coupled to VDD. A second bitline (e.g., a complementary bitline) may be coupled to a node between the second NMOS transistor and the second PMOS transistor. This may allow the second bitline to be pulled up to the voltage level of VDD or pulled down to the ground voltage level. Thus, when writing a bit to a memory cell, the first bitline may be pulled up and the second bitline may be pulled down (or vice versa).

The first and second NMOS transistors may be controlled by first and second logic circuits, respectively. A first example logic circuit includes a NOR gate or other appropriate logic gate that receives as inputs a write enable signal (e.g., a write multiplexing signal) and a signal derived from a data signal. A second example logic circuit includes a NOR gate or other appropriate logic gate that receives as inputs the write enable signal and a signal derived from a complementary data signal. Both the signal derived from the data signal and the signal derived from the complementary data signal may also be derived from a masking signal as well in some implementations.

The first and second PMOS transistors may be controlled by the signals that are used to control the NMOS transistors in some implementations. For instance, in one implementation, the first PMOS transistor is controlled by the signal that is used to control the second NMOS transistor, and the second PMOS transistor is controlled by the signal that is used to control the first NMOS transistor.

In another implementation, the first PMOS transistor is controlled by the signal derived from the complementary data signal, and the second PMOS transistor is controlled by the signal derived from the data signal. Continuing with this example implementation, additional PMOS transistors may be disposed between the first and second PMOS transistors and VDD, those additional PMOS transistors being controlled by a write multiplexing signal.

An example write masking operation may be performed by causing both bitlines to float. This may be accomplished by turning off the first and second PMOS transistors as well as the first and second NMOS transistors. In an implementation in which the signals derived from the data and the complementary data are also derived from the write masking signal, when the write masking signal is at its active value, digital ones are applied to the PMOS transistors, and digital zeros are applied to the NMOS transistors. In addition to both writing and masking, a column of memory cells may be deselected by applying the write multiplexing signal to isolate the bitlines from ground and VDD.

Various implementations may also include methods. An example method may include writing a bit to a memory cell by turning on the first PMOS transistor to couple the first bitline to VDD, turning off the first NMOS transistor to isolate the first bitline from ground, turning off the second PMOS transistor to isolate the second bitline from VDD, and turning on the second NMOS transistor to couple the second bitline to ground. This action applies a bit of data to the memory cell using complementary bitlines. Additionally, as noted above, other actions may include a masking operation according to a masking signal and deselecting the memory cell according to a write multiplexing signal.

Various implementations may include advantages over other systems. One advantage includes using PMOS transistors rather than NMOS transistors to couple each bitline to VDD. Put another way, various implementations may avoid coupling the bitlines to VDD by NMOS transistors. By contrast, a system using NMOS transistors to couple the bitlines to VDD may suffer from a voltage drop equal to the threshold voltage Vt of the NMOS transistors (VDD minus Vt). However, various implementations described herein using PMOS transistors may allow the bitlines to reach the full VDD voltage level when appropriate, which may increase writability.

Another advantage of some implementations may include increased bit cell stability when performing masking operations. Specifically, various implementations described herein use logic circuits to control the NMOS transistors, and those logic circuits receive as input a signal derived from the data signal (or complementary data signal) and a write masking signal. As a result, both the first and second PMOS transistors and the first and second NMOS transistors may be turned off at the same time, thereby allowing the first and second bitlines to float. Floating masking may improve bit cell static noise margin, thereby providing greater bit cell stability and greater static noise margin (NM) as compared to other systems that would apply a digital 1 on both bitlines.

Additionally, various implementations herein may avoid or limit the use of dynamic nodes that would cause charge sharing across NMOS transistors. As a result, write operations following masking operations may have a lower chance of compromised writability. The increase in writability and NM may in some instances lead to greater yield for devices in production.

Some implementations provide the above-identified advantages at a cost of increased control signaling complexity. For instance, as noted above, some implementations include using PMOS transistors to couple to VDD while using NMOS transistors to couple to ground. That combination may allow for increased writability, but as a result, a same control signal would not be applied to both the PMOS and NMOS transistors to achieve the same state at all the different transistors, such as all being off to float the bit lines. As noted above, floating the bit lines may allow for a greater NM. One of the added complexities results from a constraint in some implementations that the control signaling circuitry (e.g., logic circuitry 410, 411, 510, 511) use a static complementary metal oxide semiconductor (CMOS) design so that the inputs to the various transistors are either a one or a zero but not undefined or floating. In any event, the various implementations described herein provide systems and methods for writing data to memory cells within a memory array while maintaining a relatively high NM and level of writability using the structural features and complex control signaling described in more detail below.

Various aspects of a memory will now be presented in the context of a static random access memory (SRAM). SRAM is volatile memory that requires power to retain data. However, as those skilled in the art will readily appreciate, such aspects may be extended to other memories and/or circuit configurations. Examples of other memories include random access memory (RAM), dynamic RAM (DRAM), synchronous dynamic RAM (SDRAM), double data rate RAM (DDRAM), read only memory (ROM), programmable ROM (PROM), erasable PROM (EPROM), electrically erasable PROM (EEPROM), a general register on a processor, processor cache, flash memory, or any other suitable memory. Accordingly, all references to an SRAM are intended only to illustrate exemplary aspects of memory with the understanding that such aspects may be extended to a wide range of applications.

FIG. 1 is a conceptual block diagram illustrating an example of a processing system 100, according to one implementation. The processing system 100 includes a processor 102 and a memory 104. The processor 102 may be a microprocessor, microcontroller, digital signal processor (DSP), programmable logic implementing a processor, or other processing circuitry. The memory 104 may be a multibank memory, such as a static random access memory (SRAM), or any other multibank component capable of retrieving and storing information. As explained in more detail with respect to FIGS. 2 and 3, memory 104 may include write driver circuits configured to allow the bitlines to float during a masking operation as well as to couple the bitlines to a voltage level associated with VDD during write operations.

The processor 102 illustrated in FIG. 1 is connected to the memory 104. The connections between the processor 102 and the memory 104 may include an address bus 106, a write data bus 108, a read data bus 110, and a control bus 112. The write data bus 108 may be used to write data from the processor 102 to the memory 104. The control bus 112 may include signals used to control the writing of data from the processor 102 to the memory 104. The read data bus 110 may be used to read data from the memory 104 to the processor 102. The control bus 112 may include signals used to control the reading of data from the memory 104 to the processor 102. For example, the control bus 112 may include signals such as a read signal and a write signal. The read signal may be a single signal line, e.g., a single bit, that indicates when the memory is being read by the processor 102. The write signal may be a single signal line that indicates when the memory is being written by the processor 102. In some examples, the control bus 112 may also include a byte enable signal. The byte enable signal may be a group of signal lines that indicate the size of the data, e.g., 8, 16, 32, 64 bytes, etc. In some examples, however, the size of the data may be fixed, e.g., 8, 16, 32, 64 bytes, etc. Accordingly, the byte enable signal may be optional on the control bus 112.

The control bus 112 may include a read signal and a write signal. The read signal and the write signal may be used to generate a read enable and a write enable, respectively, within the memory 104 as will be discussed in greater detail with respect to FIG. 3.

The address bus 106 may be used to indicate which location within the memory 104 the processor is reading or writing. For example, if the processor 102 wishes to read a memory location in the memory 104 the processor 102 may output the address of the memory location on the address bus 106. Additionally, the processor 102 may drive the read signal, which may be part of the control bus 112, active. The memory 104 may then output the data in the memory location indicated by the address bus 106 on the read data bus 110. Similarly, if the processor 102 is writing a memory location in the memory 104, the processor 102 may output the address of the memory location to be written on the address bus 106. Additionally, the processor 102 may drive the write signal, which may be part of the control bus 112, active. The processor 102 may drive the write data bus 108 with the data that is to be written to the memory 104.

The write data bus 108 and the read data bus 110 are illustrated as separate buses in FIG. 1. In other examples, however, a single bidirectional data bus may be used to write data from the processor 102 to the memory 104 and to read data from the memory 104 to the processor 102. Systems using a single bidirectional data bus may be used to write data from the processor 102 to the memory 104 and to read data from the memory 104 to the processor 102. It may include various control signals to allow for the use of a single bidirectional data bus, such as a read/write signal and a data valid signal. The read/write signal may indicate when data is being read or written. The data valid signal may indicate if data on the bidirectional data bus is valid data. Of course, the scope of implementations is not limited to that shown in FIG. 1. For instance, in an implementation that includes processor cache, there may be different connections between the processor 102 and the memory 104 than those shown in FIG. 1. However, the concepts discussed herein may be applied to any appropriate implementation.

Figure 2:
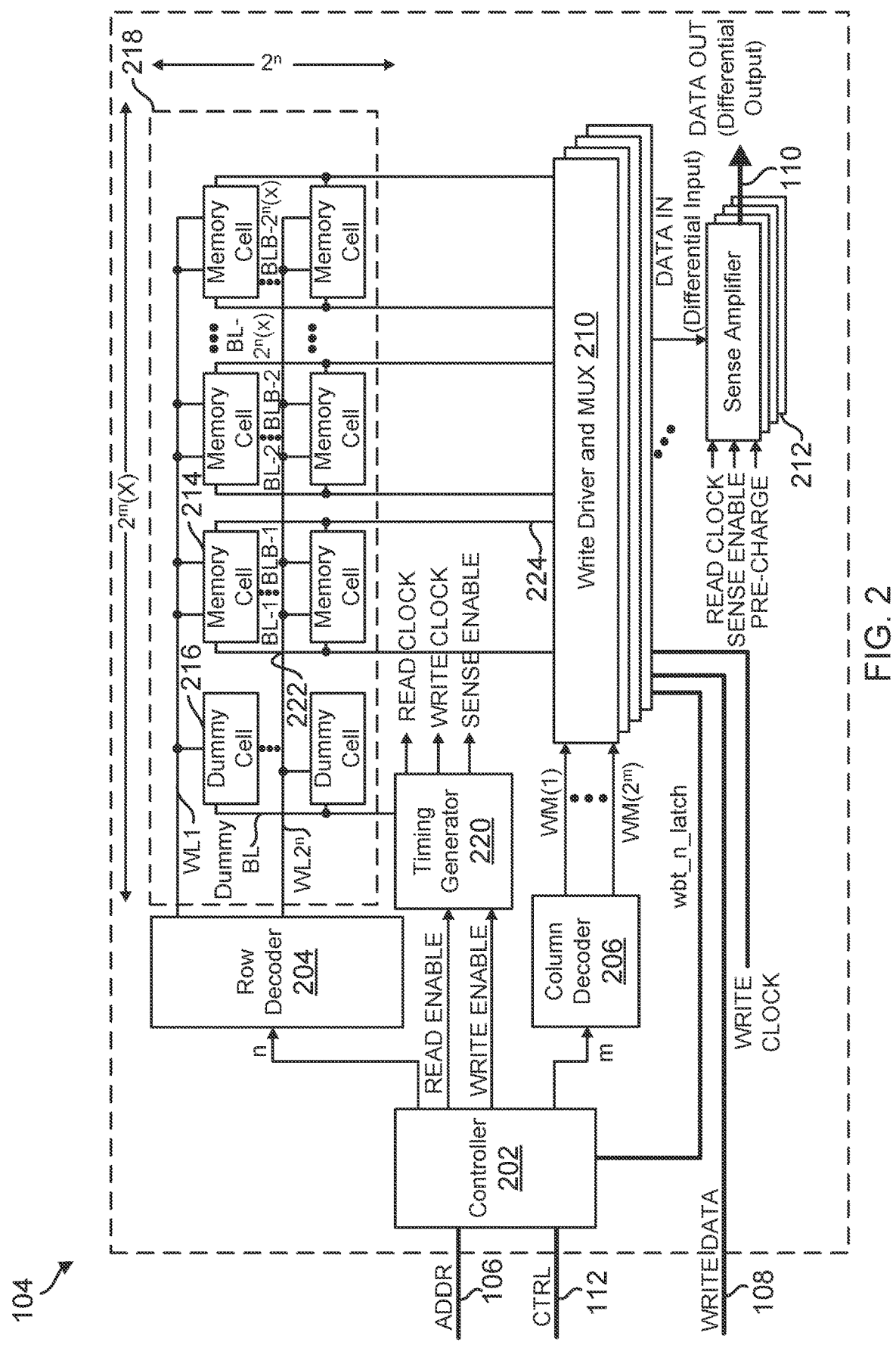
FIG. 2 is a functional block diagram of an exemplary implementation of a memory, according to one implementation.

FIG. 2 is a functional block diagram of an exemplary implementation of a memory 104. The memory bank may be a static random-access memory (SRAM). The memory 104 may include a memory array 218 with supporting circuitry to decode addresses and perform read and write operations. The memory array 218 may include memory cells 214 for storing data. For example, the memory cell 214 may be a bit cell storing a bit of data.

The memory cell 214 may be arranged to share connections in horizontal rows and vertical columns. Specifically, each horizontal row of memory cells 214 may share a wordline WL, and each vertical column of memory cells 214 may share a pair of bitlines (e.g., BL-1 222 and BLB-1 224). The size of the memory array 218 (i.e., the number of cells) may vary depending on a variety of factors including the specific application, the speed requirements, die layout constraints and testing requirements, and the overall design constraints imposed on the system. The memory array 218 may contain thousands or millions of memory cells, and the scope of implementations is not limited to any specific number of memory cells in the array 218.

In the exemplary implementation of the memory 104 illustrated in FIG. 2, the memory array 218 may include ($2^n \cdot 2^m$ (x)) memory cells 214 arranged in $2^n$ horizontal rows and $2^m$(x) vertical columns, where $2^m$ is the number of words per row and x is the number of bits per word. A peripheral device (not shown) may randomly access any word (i.e., x cells) in the memory array 218 using an (n+m) bit wide address that is provided through a controller 202 to a row decoder 204 and column decoder 206, respectively. As will be described in greater detail later, the controller 202 may be responsible for the memory read and write operations. For example, the controller may provide the timing for the read and write operations in memory. The output from the controller 202 may include an n-bit address provided to the input of a row decoder 204, and an m-bit address provided to the input of a column decoder 206. The column decoder 206 provides $2^m$ outputs (WM(1)-WM($2^m$)) with a distinct one of the outputs asserted for each different combination of address inputs. The signals wm may also be referred to herein as write multiplexing signals.

The outputs are provided to write driver 210, which includes a multiplexing function. For instance, write driver 210 may include x multiplexers. For a write memory access, each multiplexer is a $2^m$:1 multiplexer which switches each one of x inputs between $2^m$ bitline pairs based on the outputs from the column decoder 206. By way of example, a memory array that stores four (4) 128-bit words per row may use 128 4:1 multiplexers.

Figure 4:
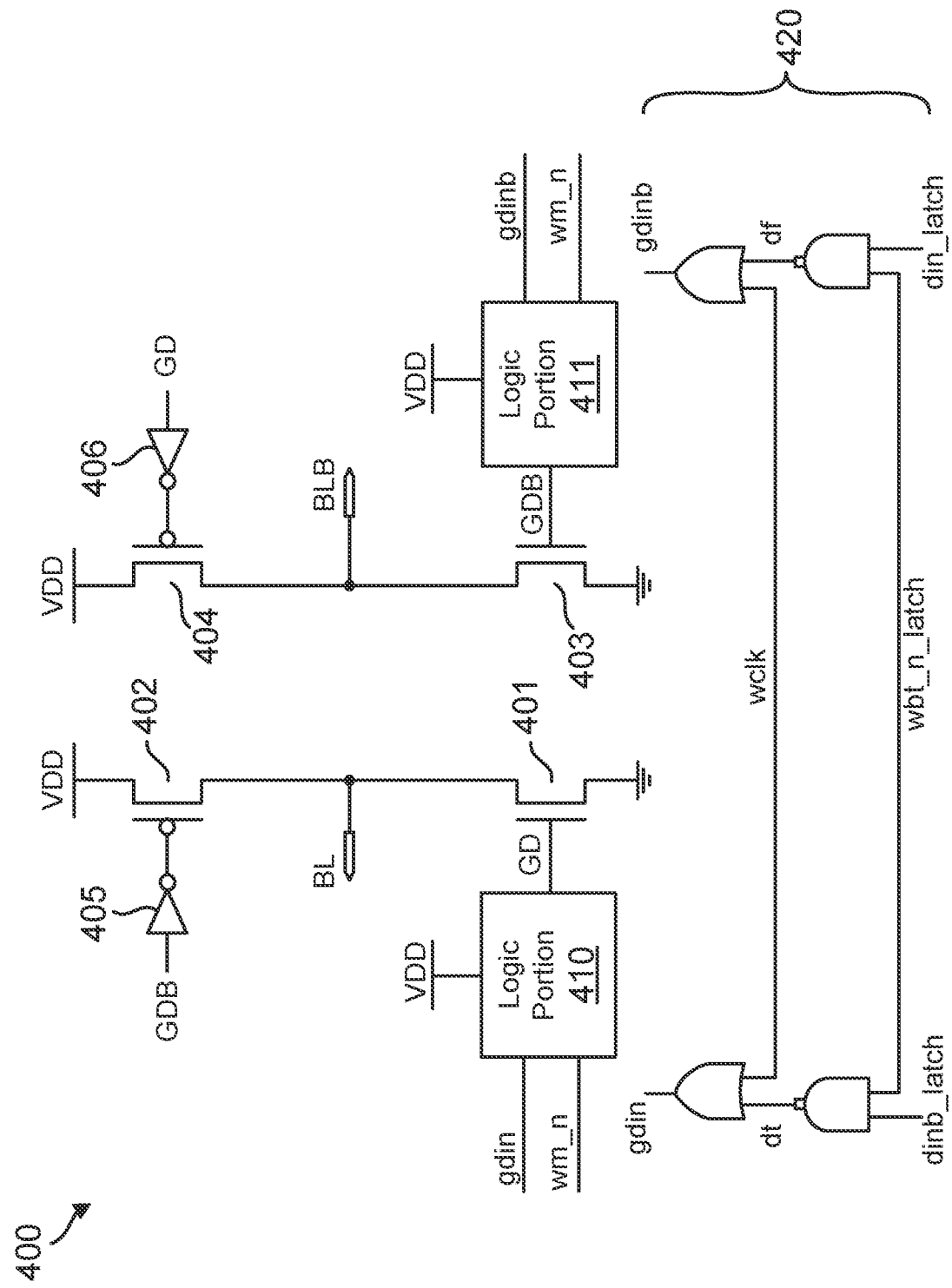
FIG. 4 is an illustration of an example write driver circuit, which may be implemented in the write driver of FIG. 2, according to one implementation.
Figure 5:
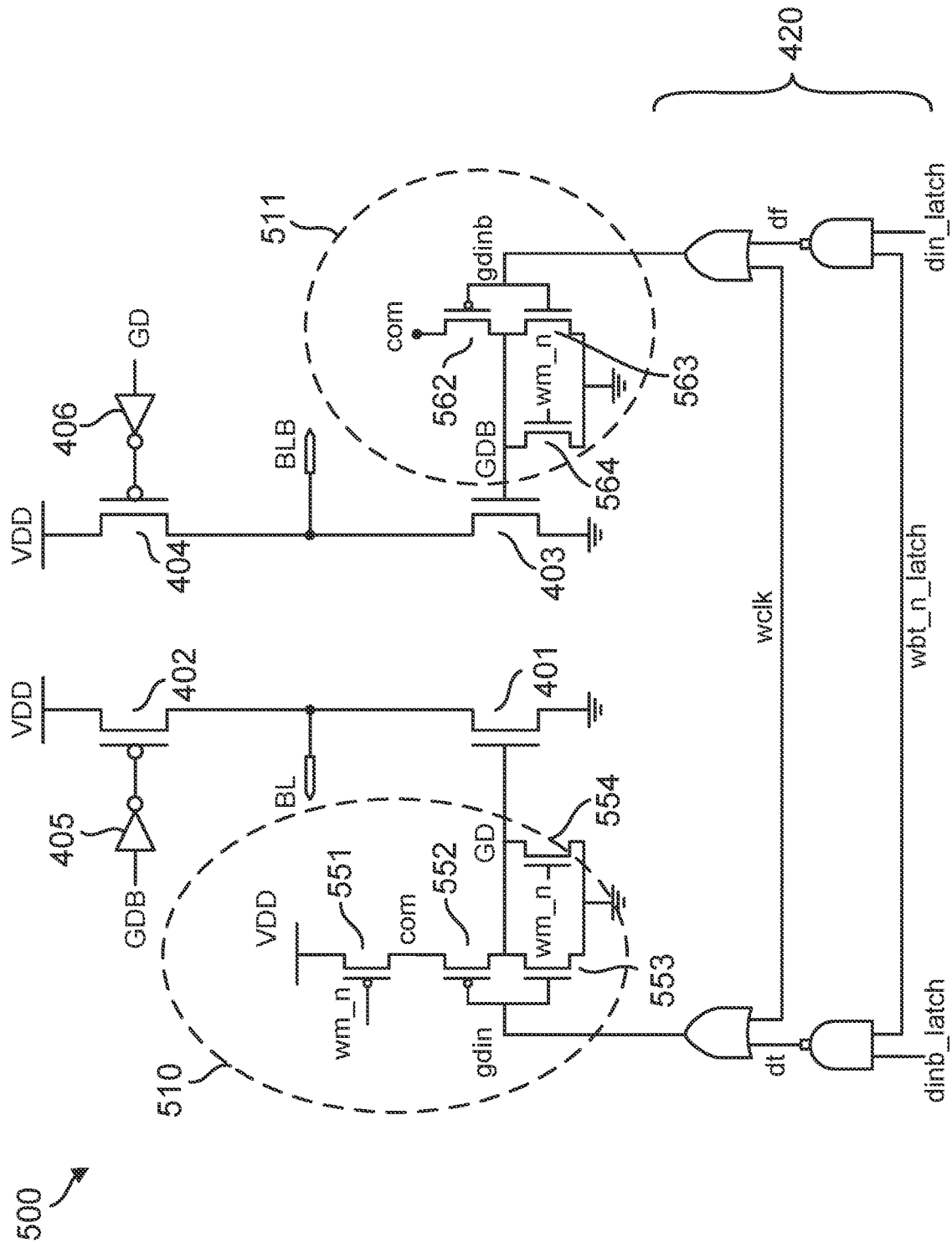
FIG. 5 is an illustration of an example write driver circuit, according to one implementation.
Figure 6:
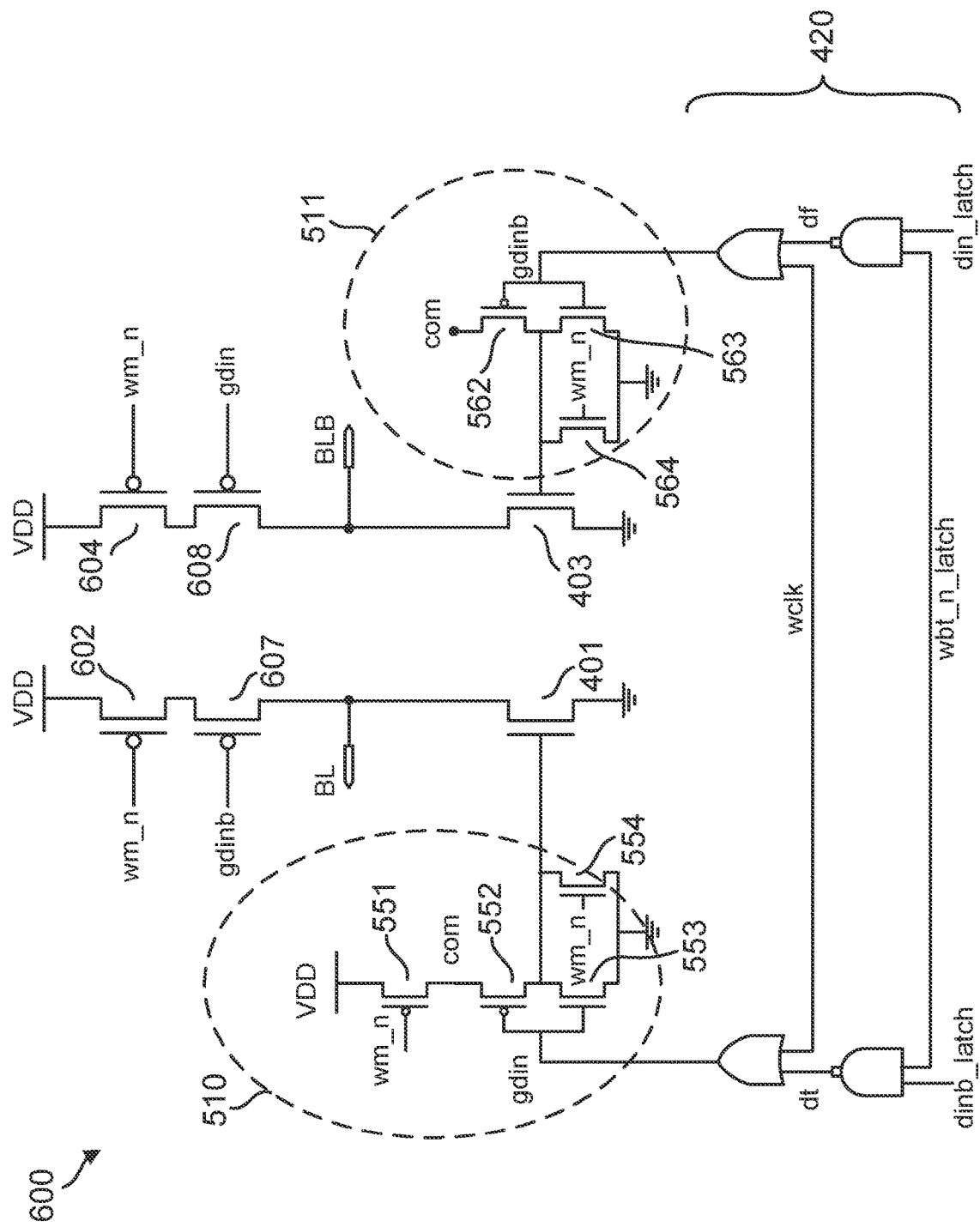
FIG. 6 is an illustration of an example write driver circuit, according to one implementation.

Various implementations shown in FIGS. 4-6 include individual write driver circuits, such as may be included in the write driver 210. As explained in more detail with respect to FIGS. 4-6, the architecture of the individual write driver circuits may be designed to increase static noise margin (NM) and writability.

When the WRITE ENABLE signal from the controller 202 is asserted, the write driver 210 outputs the Write Data received from the peripheral device (not shown) to x pairs of bitlines BL and BLB with each of the x multiplexers driving one pair of bitlines (e.g., BL-1 and BLB-1). The row decoder 204 converts the n-bit address into $2^n$ wordline outputs. A distinct wordline WL is asserted by the row decoder 204 for each different n-bit row address. As a result, each of the $2^m$(x) memory cells 214 in the horizontal row with the asserted wordline WL is connected to one pair of the $2^m$(x) bitlines (e.g., BL-1 and BLB-1) through each memory cells 214 access transistors, as will be described in more detail below with reference to FIG. 3. The write data is driven, through the x multiplexers 210, onto the selected pairs of bitlines (e.g., BL-1 and BLB-1) and written to the memory cells with the asserted wordline WL.

For a read memory access, the row decoder 204 converts the n-bit address into one of the $2^n$ read wordlines. A different read wordline WL is selected by the row decoder 204 for each different n-bit row address. As a result, each of the $2^m$(x) memory cells in the horizontal row with the selected read wordline WL is connected to one of the $2^m$(x) read bitlines BL through its access transistor, as will be described in more detail below with reference to FIG. 3. The $2^m$(x) read bitlines BL are used to transmit the bits stored by the $2^m$(x) memory cells to the x multiplexers (included in the write driver 210), with each multiplexer selecting one bit from the $2^m$ bits transmitted on the read bitlines BL to the input of that multiplexer. The selected outputs from the x multiplexers are provided to the sense amplifier 212 to be output on the read data bus 110. Accordingly, a sense amplifier, such as the sense amplifier 212 in memory 104 may provide a means for generating a first data output bit as a function of the first bit when a first read enable is active. After the READ ENABLE signal generated by the controller 202 is asserted, the selected bits are ready for the sense amplifier 212. The READ ENABLE from the controller 202 may be used to generate the READ CLOCK. Additionally, the controller 202 may generate the n and m signals for the row and column decoders, respectively. Data from the multiplexer into the sense amplifier 212 (DATA IN) may be available after the bitline BL and the wordline WL are selected, e.g., based on the n and m signals, and after the READ CLOCK is generated. Generally, there may be a delay from when the bitline BL and the wordline W L and the READ CLOCK are selected and when data from the multiplexer into the sense amplifier 212 (DATA IN) is available because accessing the memory and propagating through the multiplexer 208 may take time.

As mentioned earlier, the controller 202 is responsible for memory operations by providing the timing for the read and write operations in a memory cycle. The memory cycle may be defined by the SYSTEM CLOCK input to the controller 202. The timing of the read and write operation is derived from internal READ and WRITE CLOCKS that are used to respectively multiplex READ and WRITE ADDRESS inputs from a peripheral device to the address decoder (i.e., row decoders 204 and column decoders 206). The READ clock is set by the READ ENABLE and reset by the READ CLOCK RESET. Similarly, the WRITE CLOCK is set by the WRITE ENABLE once the read operation is complete and reset by the WRITE CLOCK RESET. The READ and WRITE ENABLES may be input to the controller 202 from a peripheral device and controlled by the peripheral device. The READ CLOCK and WRITE CLOCK RESET may be generated by a tracking circuit in the memory array 218 and input to the controller 202. The READ ENABLE may be used to generate the READ CLOCK. The WRITE ENABLE may be used to generate the WRITE CLOCK. The READ CLOCK may be generated by the timing generator 220. The timing generator 220 may be configured to control the timing of the READ CLOCK so that the sense amplifier 212 is active when the DATA IN signal(s) are valid. Similarly, the timing generator 220 may be configured to control the timing of the WRITE CLOCK so that the Write Driver 210 is active when the DWRITE DATA signal(s) are valid.

In an example, the write driver 210 may be configured to drive the bitline (BL/BLB) to write a bit to the memory cell during a write operation or to float the bitline to mask the bit during the write operation.

In the described exemplary implementation, the tracking circuit may include a column of dummy cells, e.g., dummy cell 216, in the memory array. Dummy cells, such as dummy cell 216, may be used to determine when data from a memory cell, such as memory cell 214, is valid. Each dummy cell 216 is configured to emulate the operation of a normal memory cell 214 in a row. Each dummy cell 216 is connected to the same WL for its row of memory cells 214. (Accordingly, there may be a dummy cell for each row so that each row may be monitored based on that row's dummy cell, e.g., dummy cell 216.) A timing generator 220 may be used to monitor the dummy bitline (BL) from the dummy cell 216 connected to the asserted WL. Specifically, the timing generator threshold detects the dummy BL to track the access time of the selected memory cell 214 during read and/or write operations.

By way of example, during a read operation, the timing generator 220 monitors the dummy BL and may reset the READ CLOCK when a known bit stored in the dummy cell 216 appears on the dummy BL. For example, the timing generator 220 may monitor the dummy BL to determine when the dummy BL changes from one logic state to another logic state. The change in logic state may indicate that data on the corresponding memory cell bitlines is valid. Similarly, during a write operation, the timing generator 220 monitors the dummy BL and resets the WRITE CLOCK when a known bit written to the dummy cell by the write driver 210 appears on the Dummy BL. For example, the timing generator 220 may monitor the dummy BL to determine when the dummy BL changes from one logic state to another logic state. The change in logic state may indicate that data on the corresponding memory cell bitlines is valid. Each memory cell 214 is configured to store one bit of data (e.g., a logic level "1" or a logic level "0").

Figure 3:
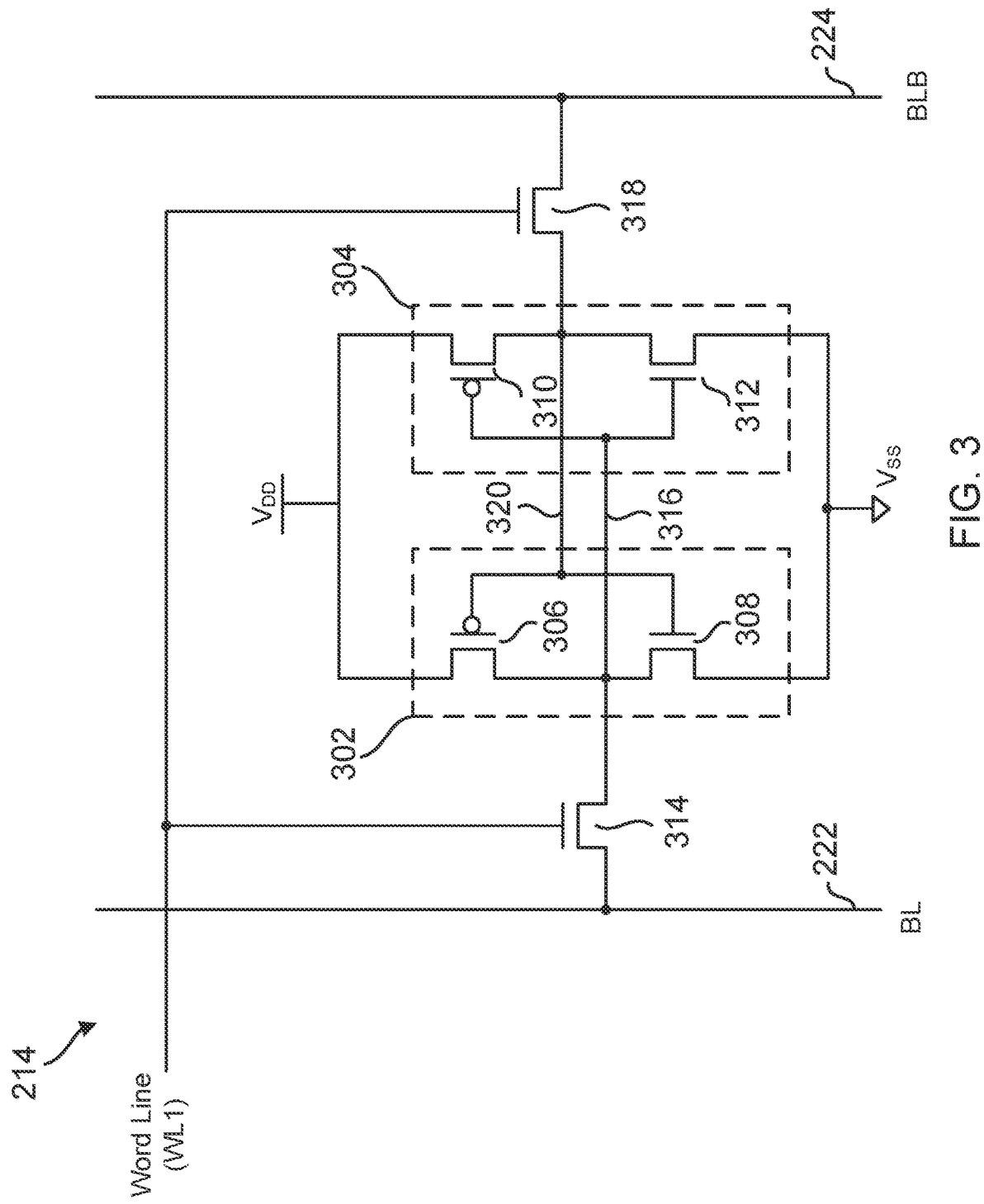
FIG. 3 is a schematic diagram of an exemplary implementation of a memory cell of a memory bank, according to one implementation.

FIG. 3 is a schematic diagram of an exemplary implementation of the memory cell 214 of FIG. 2 of a memory bank. The memory cell 214 illustrated in FIG. 3 is a six-transistor (6T) configuration. However, it is understood that any appropriate architecture may be used with the memory cell 214, such as a four-transistor (4T) configuration, an eight transistor (8T) configuration, a ten transistor (10T) configuration, or the like.

The memory cell 214 is illustrated with two inverters 302, 304. The first inverter 302 includes a positive-channel metal-oxide-semiconductor field effect (PMOS) 306 and a negative-channel metal-oxide-semiconductor field effect (NMOS) 308. The second inverter 304 includes a PMOS transistor 310 and an NMOS transistor 312. In the described implementation, the inverters 302 and 304 are powered by VDD and have a return power rail VSS (e.g., ground). The first inverter 302 and the second inverter 304 are interconnected to form a cross-coupled latch. A first NMOS access transistor 314 couples the output node 316 from the first inverter 302 to a bitline BL, and a second NMOS transistor 318 couples the output node 320 from the second inverter 304 to a bitline BLB (the value of which is the opposite or inverse of the bitline BL). The gates of the NMOS access transistors 314, 318 are coupled to a wordline WL.

A write operation may be performed by setting the bitlines BL and BLB to the value to be written to the memory cell 214 and asserting the wordline WL. The wordline WL may be asserted before the value to be written (e.g., write data) is provided to the bitlines BL and BLB. By way of example, a high value, e.g., a logic level "1" may be written to the memory cell 214 by setting the bitline BL to a logic level "0" and the bitline BLB to a logic level "1." The logic level "0" at the bitline BL is applied to the second inverter 304 through the first NMOS transistor 314, which in turn forces the output node 320 of the second inverter 304 to VDD. The output node 320 of the second inverter 304 is applied to the input of the first inverter 302, which in turn forces the output node 316 of the first inverter 302 to VSS. A logic level "0" may be written to the memory cell 214 by inverting the values of the bitlines BL and BLB. The write driver 210 may be designed to be stronger than pull-up transistors (PMOS transistor 306 and PMOS transistor 310) in the memory cell 214 so that the write driver 210 can override the previous state of the cross-coupled inverters 302, 304.

Once the write operation is complete, the wordline is de-asserted, thereby causing the NMOS access transistors 314 and 318 to disconnect the bitlines BL and BLB from the two inverters 302, 304. The cross-coupling between the two inverters 302, 304 maintains the state of the inverter outputs as long as power is applied to the memory cell 214.

The memory cell 214 stores data according to the data values stored at output nodes 316 and 320. If the memory cell 214 stores a logic high (i.e., a '1'), then output node 316 is at a logic high and output node 320 is at a logic low (i.e., a '0'). If the memory cell 214 stores a logic low, then output node 316 is at a logic low and output node 320 is at logic high. During a read operation, differential bitlines BL a and BLB-1 may be pre-charged by a pre-charge circuit. The word line WL is then asserted, thereby turning on NMOS transistors 314, 318. The timing between the pre-charging and asserting the wordline WL may be controlled by the row decoder 204.

If memory cell 214 stores a logic high, then bitline BL-1 remains charged via the first NMOS access transistor 314, and complimentary bitline BLB-1 is discharged via the second NMOS transistor 318. If memory cell 214 stores a logic low, then bitline BL-1 is discharged via the first NMOS transistor 314, and complimentary bitline BLB-1 remains charged via the second NMOS transistor 318.

FIG. 4 is an illustration of write driver circuit 400, which may be implemented in write driver 210 of FIG. 2 to write to a memory cell 214, according to one implementation. Looking at the signals dinb_latch and din_latch are data signals that are complementary to each other, and they are received at data input interface circuitry 420. The signal wbt_n_latch is a write masking signal. Masking may be a feature of the memory 104, and it allows data to be written to multiple memory cells at a time, while leaving some of the cells unwritten. The signal wclk is a write clock, and it may be generated internal to the memory 104. The signal wm_n is a write multiplexing signal that is described above with respect to FIG. 2, where it corresponds to "WM", and it allows for a particular column of memory cells to be selected. The signal wm_n may also be referred to as a write enable signal in some instances. The signals gdin and gdinb are signals that are derived from the data signals (din_latch and dinb_latch) and the write masking signal (wbt_n_latch). In this particular example, both the write multiplexing signal and the write masking signal are active low, though the scope of implementations is not limited thereto.

The write driver circuit 400 includes a first negative-channel metal oxide semiconductor (NMOS) transistor 401 coupled in series with a first positive-channel metal oxide semiconductor (PMOS) transistor 402. NMOS transistor 401 is coupled to ground, and PMOS transistor 402 is coupled to a power supply (VDD). A second NMOS transistor 403 is coupled in series with a second PMOS transistor 404. NMOS transistor 403 is coupled to ground, and PMOS transistor 404 is coupled to VDD.

The write driver circuit 400 also includes a first bitline (BL) coupled to a first node between NMOS transistor 401 and PMOS transistor 402. Complimentary bitline BLB is coupled to a second node between NMOS transistor 403 and PMOS transistor 404.

A logic portion 410 is configured to provide a first control signal (GD) to a gate of NMOS transistor 401. Logic portion 410 has two inputs in this example, where a first input receives a signal (gdin) that is derived from the data signal (dinb_latch) and a second input receives the write multiplexing signal (wm_n). Logic portion 411 operates similarly. Specifically, logic portion 411 provides a second control signal (GDB) to a gate of NMOS transistor 403. Logic portion 411 has two inputs—one input receives a signal (gdinb) derived from the complementary data signal (din_latch) and another input receives the write multiplexing signal (wm_n).

Logic portions 410, 411 are shown in FIG. 4 as boxes, and they may be implemented by any appropriate logic circuit. For instance, FIG. 5 (explained in more detail below) implements logic portions 410 and 411 using Boolean NOR gate circuits, though the scope of implementations may include other appropriate circuits as well. Furthermore, while the signals gdin and gdinb are described as being derived from the data and complementary data signals and write multiplexing signal, as shown in FIG. 4 they are also derived from the write masking signal since the data signals are processed through data input interface circuitry 420 with the write masking signal.

Figure 9:
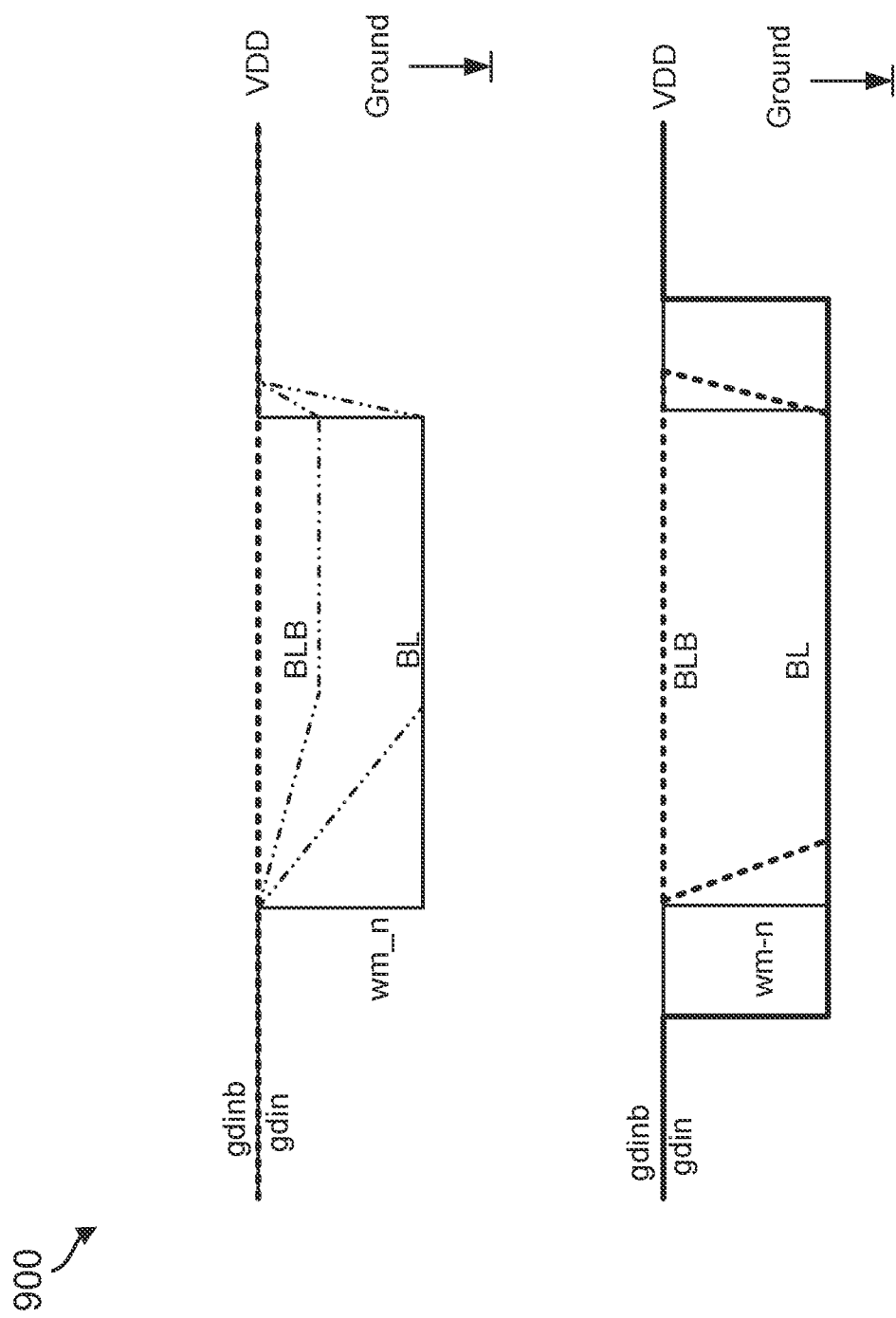
FIG. 9 is an illustration of two waveforms illustrating a write masking operation and a writing operation, according to one implementation.

During a masked write, the masking signal wbt_n_latch is zero. That causes dt and df to go to 1, which causes both gdin and gdinb to go to 1. This is shown in upper waveform of FIG. 9. Also, at this point wm_n is 0, so GD and GDB are both 0. The bitlines BL, BLB are isolated from ground because transistors 401, 403 are off. Similarly, both transistors 402, 404 are also turned off so that bitlines BL, BLB are isolated from VDD. In other words, during the write masking operation, both bitlines BL, BLB float. As explained above, floating bitlines may provide greater cell stability and static noise margin when compared to other systems that put both bitlines at a digital 1 during a write masking operation.

During an example memory write operation, the masking signal is a digital 1, so it does not mask the data input. Regarding the data input signals din_latch, dinb_latch, one of them is 1 and the other is 0. One of gdin and gdinb is 1, and the other is 0, but for the sake of example, gdinb is 1, and gdin is 0. When a write operation starts, wm_n becomes 0. Now GD is a 1, and GDB is a 0. So the transistor 401 receiving GD is on, and the transistor 403 receiving GDB is off. This operation is shown in the lower waveform on FIG. 9. As noted, GD is 1 so transistor 404 is on, and GDB is 0 so transistor 402 is off. This pulls down BL and pulls up BLB. In another example, gdinb is 0, and gdin is 1, which causes GD to be 0 and GDB to be 1, thereby pulling up BL and pulling down BLB. This write operation provides the enhanced writability because BLB is coupled to the voltage level of VDD and BL is at ground. This is in contrast to a system in which transistors 402/404 are NMOS transistors so that the highest voltage that BL/BLB would reach would be VDD minus Vt.

Also of note is that logic portions 410, 411 may include static complementary metal oxide semiconductor (CMOS) circuits. In other words, logic portions 410, 411 have a defined output of either a digital 1 or a digital 0 and not take on an undefined or floating state. Thus, transistors 401, 403 are controlled by a signal that alternates between digital 1 and digital 0 and avoid undefined or floating levels, at least during masking and writing. As a result, write driver circuit 400 may provide both a write masking operation in which BL, BLB float as well as write operations with complementary data.

FIG. 5 is an illustration of write driver circuit 500, which may be implemented in write driver 210 of FIG. 2 to write to a memory cell 214, according to one implementation. FIG. 5 is offered to show one particular implementation of logic portions 410, 411. FIG. 5 is similar to FIG. 4, though FIG. 5 illustrates NOR gates 510, 511 as logic portions 410, 411 respectively. Write driver circuit 500 operates the same for write operations and write masking operations as does write driver circuit 400 of FIG. 4 (described in more detail above).

Looking at NOR gate 510 first, it has two PMOS transistors 551, 552 arranged in series on the top, and it has two NMOS transistors 553, 554 arranged in parallel on the bottom. In short, NOR gate 510 couples the gate of transistor 401 to ground or VDD, depending on the values of wm_n and gdin. Table 1 is a truth table for the NOR gate 510:

TABLE 1

| wm_n | gdin | GD |
|------|------|----|
| 0 | 0 | 1 |
| 0 | 1 | 0 |
| 1 | 0 | 0 |
| 1 | 1 | 0 |

Similarly, NOR gate 511 has two NMOS transistors 563, 564 in parallel on the bottom. Transistor 562 is coupled to the "com" node, so that NOR gate 511 shares transistor 551 with NOR gate 510. NOR gate 511 couples the gate of transistor 403 to ground or VDD, depending on the values of wm_n and gdinb. Table 2 is a truth table for NOR gate 511.

TABLE 2

| wm_n | gdinb | GDB |
|------|-------|-----|
| 0 | 0 | 1 |
| 0 | 1 | 0 |
| 1 | 0 | 0 |
| 1 | 1 | 0 |

FIG. 6 is an illustration of write driver circuit 600, which may be implemented in write driver 210 of FIG. 2 to write to a memory cell 214, according to one implementation. Write driver circuit 600 is similar to the circuits discussed above with respect to FIGS. 4 and 5. However, write driver circuit 600 replaces transistors 402, 404 with a total of four transistors 602, 604, 607, 608.

Transistors 602, 604 are gate-coupled to the write multiplexing signal wm_n, and transistors 607, 608 are gate-coupled to the signal derived from data and complementary data gdinb, gdin, respectively. Otherwise, write driver circuit 600 operates the same as write driver circuit 500 of FIG. 5.

An advantage of write driver circuit 600 is that it uses the four transistors 602, 604, 607, 608 in order to omit the inverters 405, 406 of write driver circuits 400, 500. As a result, write driver circuit 600 actually uses a fewer number of transistors, thereby saving semiconductor chip space. However, a potential issue with write driver circuit 600 is that it includes a dynamic node between transistors 602, 607 as well as between transistors 604, 608. As noted above, a dynamic node may have a charge sharing issue where a write operation follows a write mask operation in some instances. While some implementations may find write driver circuit 600 acceptable for use in a system including write mask operations (and others may find it unacceptable), other implementations that omit write mask operations may find that write driver circuit 600 is an advantageous choice due to its fewer number of transistors.

Figure 7:
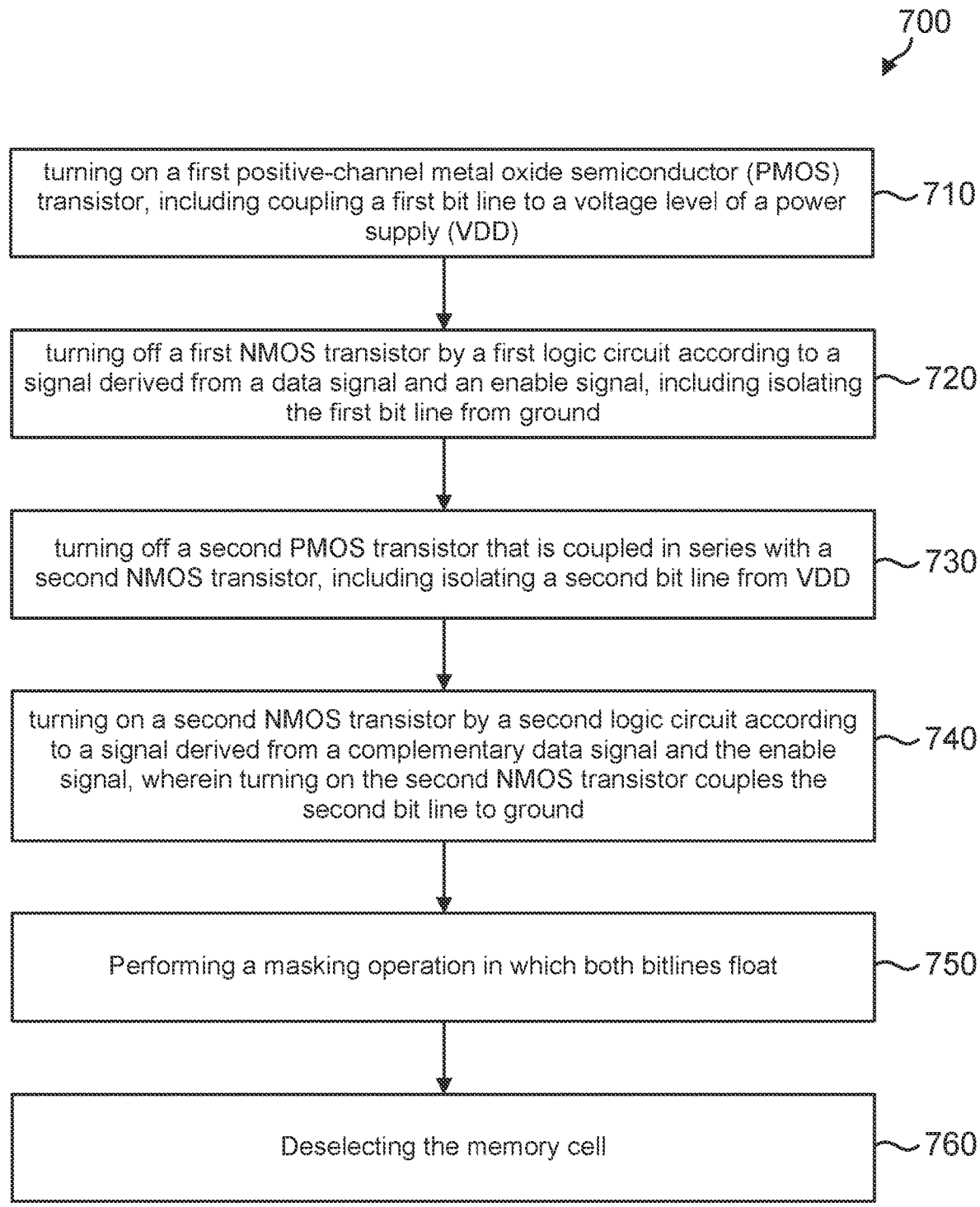
FIG. 7 is an illustration of an example method for operating a semiconductor device, such as a write driver circuit, according to one implementation.

Some implementations include methods, such as method 700 of FIG. 7. Method 700 is an example method for operating a semiconductor device, such as a write driver circuit as described in FIGS. 2 and 4-6. While the example actions are described with respect to a write driver circuit, it is understood that the write driver circuit may be under control of other logic, such as controller 202 of FIG. 2, either directly or indirectly.

Actions 710-740 are directed to a data write operation. At action 710, the method includes turning on a first PMOS transistor, including coupling a first bitline to a voltage level of a power supply. An example is shown in FIGS. 4 and 5 in which during a write operation one of the PMOS transistors 402, 404 would turn on, thereby coupling its respective bitline to VDD. In the example of FIG. 6, one of the PMOS transistors 607, 608 would be turned on during a write operation. Also, during a write operation, both transistors 602, 604 would be turned on by the write multiplexing signal.

At action 720, a first NMOS transistor is turned off by a first logic circuit according to a signal derived from a data signal and an enable signal. The result is that the bitline is isolated from ground. In an example in which PMOS transistor 402 is turned on at action 710, NMOS transistor 401 would be turned off. Similarly, in an example in which PMOS transistor 404 is turned on, NMOS transistor 403 would be turned off. Looking at an example in which the first NMOS transistor is turned off according to a signal derived from a data signal and an enable signal, an example is shown at FIGS. 4-6 in which transistor 401 is turned off according to gdin and wm_n (the write multiplexing signal, a type of enable signal). In another example, transistor 403 is turned off according to gdinb and wm_n. Turning off an NMOS transistor in these examples isolates a corresponding bitline from ground.

At action 730, the method includes turning off a second PMOS transistor that is coupled in series with a second NMOS transistor. As explained above, in an instance in which PMOS transistor 402 is turned on, transistor 404 would be turned off during a write operation because the write driver circuits 400, 600 handle complementary data signals (e.g., data and a data bar). Similarly, in an example in which transistor 404 is turned on, transistor 402 would be turned off.

Actions 710 and 730 include turning PMOS transistors on or off. Actions 710 and 730 may be carried out in any appropriate manner, such as in the examples of FIGS. 4-6. In the examples of FIGS. 4 and 5, transistors 402, 404 are turned on and off using signals GD, GDB, which are produced by logic portions 410, 411 based on a signal derived from data or complementary data and the write multiplexing signal. In the example of FIG. 6, transistors 607, 608 are turned on or off according to the signals derived from data and complementary data, and transistors 602, 604 are turned on or off based on a write multiplexing signal (a type of enable signal). Turning off a particular PMOS transistor isolates its corresponding bitline from the power source VDD.

At action 740, the method includes turning on a second NMOS transistor by a second logic circuit according to a signal derived from a complementary data signal and the enable signal. For instance, the method may include turning on NMOS transistor 403 using logic portion 411. Or in an instance in which PMOS transistor 404 is turned on, action 740 may include turning off transistor 401 using logic portion 410. The result is that the corresponding bitline is coupled to ground.

As a result of actions 710-740, one of two complementary bitline states are achieved. 1) BL is at digital 1 and BLB is at digital 0, or 2) BL is at digital 0 in BLB is a digital 1. In either event, the actions cause either a bit value of 1 or 0 to be stored in a memory cell, an example of which is shown in FIG. 3.

At action 750, the write driver circuit performs a masking operation in which both bitlines float. In the examples of FIGS. 4-6, when the write masking signal wbt_n_latch has a value of digital 0, a write masking operation may be carried out. As described above, that particular value for the write masking signal causes both GD and GDB to take on a value of digital 0, which turns off transistors 401-404 in the examples of FIGS. 4-5 and transistors 401, 403, 607, 608 in the example of FIG. 6.

At action 760, the write driver circuit de-selects the memory cell. As noted above, the controller 202 of FIG. 2 may determine not to select a particular column of memory cells by applying a digital 1 as the write multiplexing signal wm_n. By contrast, during a write operation directed toward that particular column of memory cells, the write multiplexing signal would have a value of digital 0 in the example of FIGS. 4-6. In the example of FIGS. 4-5, a digital 1 value for the write multiplexing signal would turn off transistors 401-404, and in the example of FIG. 6 would turn off the transistors 401, 403, 602, 604. Such action causes both bitlines BL, BLB to float, which preserves the value stored in the memory cell. In these examples, the write multiplexing signal has a value of digital 1 unless that particular column of memory cells is being written to.

The scope of implementations is not limited to the specific actions shown in FIG. 7. Rather, other implementations may add, omit, rearrange, or modify one or more the actions. In one example, action 750 is performed during testing of a device but is not performed during mission mode operation. Accordingly, mission mode operation may include actions 710-740 and 760 but may omit action 750. However, in other examples, such as testing of a device, action 750 may be performed before or after the other actions as appropriate. Furthermore, during mission mode operation that has write operations, actions 710-740 and 760 may be repeated as often as is appropriate to write data to a bank of memory cells. Furthermore, it is understood that the actions 710-760 are described with respect to a single write driver circuit, though the scope of implementations may include a multitude of write driver circuits including same or similar actions to write data to other memory cells.

Various implementations described herein may be suitable for use in a system on chip (SOC). An example of a SOC includes a semiconductor chip having multiple processing devices within it, including a graphics processing unit (GPU), a central processing unit (CPU), a modem unit, a camera unit, and the like. In some examples, the SOC may be included within a chip package, mounted on a printed circuit board, and disposed within a portable device, such as a smart phone or tablet computer. However, the scope of implementations is not limited to a chip implemented within a tablet computer or smart phone, as other applications are possible.

Figure 8:
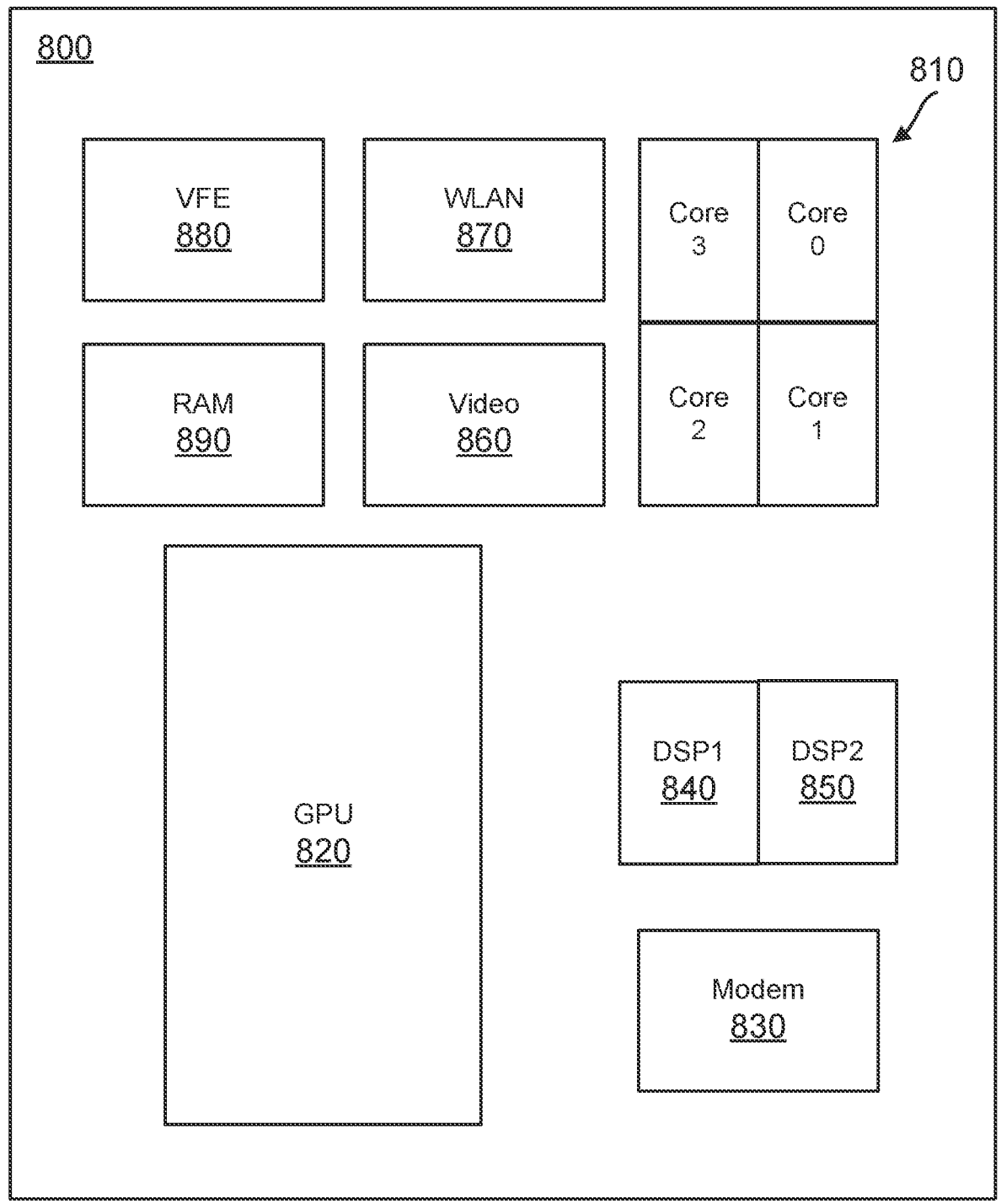
FIG. 8 is an illustration of an example system on chip (SOC) which may include a memory as in FIG. 2, according to one implementation.

FIG. 8 is an illustration of example SOC 800, according to one implementation. In this example, SOC 800 is implemented on a semiconductor die, and it includes multiple system components 810-890. Specifically, in this example, SOC 800 includes CPU 810 that is a multi-core general-purpose processor having four processor cores, core 0-core 3. Of course, the scope of implementations is not limited to any particular number of cores, as other implementations may include two cores, eight cores, or any other appropriate number of cores in the CPU 810. SOC 800 further includes other system components, such as a first digital signal processor (DSP) 840, a second DSP 850, a modem 830, GPU 820, a video subsystem 860, a wireless local area network (WLAN) transceiver 870, and a video-front-end (VFE) subsystem 880. SOC 800 also includes RAM memory unit 890, which may operate as system RAM for any of the components 810-880.

RAM memory unit 890 may include write driver circuits, such as those described above with respect to FIGS. 2 and 4-6. RAM memory unit 890 may receive data and instructions from any of the components 110-180 in a manner the same as or similar to that described above with respect to FIG. 1. Furthermore, RAM memory unit 890 may perform the actions of FIG. 7 to perform write operations and write masking operations.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

Implementation examples are described in the following numbered clauses:

1. A static random-access memory (SRAM) write circuit comprising:
    a first NMOS transistor coupled in series with a first PMOS transistor, the first NMOS transistor being coupled to ground, and the first PMOS transistor being coupled to a power supply (VDD);
    a second NMOS transistor coupled in series with a second PMOS transistor, the second NMOS transistor being coupled to ground, and the second PMOS transistor being coupled to the VDD;
    a first bitline coupled to a first node between the first NMOS transistor and the first PMOS transistor;
    a second bitline coupled to a second node between the second NMOS transistor and the second PMOS transistor;
    a first logic circuit configured to provide a first control signal to a gate of the first NMOS transistor, the first logic circuit having a first input configured to receive a signal derived from a data signal and a second input configured to receive a write enable signal; and
    a second logic circuit configured to provide a second control signal to a gate of the second NMOS transistor, the second logic circuit having a third input configured to receive a signal derived from a complementary data signal and a fourth input configured to receive the write enable signal.

2. The SRAM write circuit of clause 1, wherein the first control signal is applied to the second PMOS transistor through a first inverting logic circuit, and wherein the second control signal is applied to the first PMOS transistor through a second inverting logic circuit.

3. The SRAM write circuit of clause 1, wherein the first PMOS transistor is coupled to the signal derived from the complementary data signal, and wherein the second PMOS transistor is coupled to the signal derived from the data signal.

4. The SRAM write circuit of clause 3, further comprising:
    a third PMOS transistor coupled in series with the first PMOS transistor; and
    a fourth PMOS transistor coupled in series with the second PMOS transistor, wherein the third PMOS transistor is gate-coupled to the write enable signal, and wherein the fourth PMOS transistor is gate-coupled to the write enable signal.

5. The SRAM write circuit of clauses 1-4, wherein the first logic circuit comprises a NOR gate.

6. The SRAM write circuit of clauses 1-5, wherein the first logic circuit and the second logic circuit are static complementary metal oxide semiconductor (CMOS) circuits.

7. The SRAM write circuit of clauses 1-6, wherein the signal derived from the data signal is further derived from a third control signal, and wherein the signal derived from the complementary data signal is further derived from the third control signal.

8. The SRAM write circuit of clause 7, wherein the first logic circuit and the second logic circuit are configured to cause the first bitline and the second bitline to float according to the third control signal.

9. The SRAM write circuit of clauses 1-8, wherein the first control signal and the second control signal are complimentary when the write enable signal is high; and the first control signal and the second control signal are both low when the write enable signal is low.

10. The SRAM write circuit of clauses 1-9, wherein the write enable signal is a write multiplexing signal.

11. A method of operating a semiconductor device, the method comprising:
writing a bit to a memory cell, including:
turning on a first PMOS transistor, wherein the first PMOS transistor is coupled in series with a first NMOS transistor, wherein turning on the first PMOS transistor couples a first bitline to a voltage level of a power supply (VDD);
turning off the first NMOS transistor, wherein the first NMOS transistor is controlled by a first logic circuit providing a first control signal to a gate of the first NMOS transistor, the first logic circuit having a first input configured to receive a signal derived from a data signal and a second input configured to receive an enable signal, wherein turning off the first NMOS transistor isolates the first bitline from ground;
turning off a second PMOS transistor that is coupled in series with a second NMOS transistor, including isolating a second bitline from VDD; and
turning on a second NMOS transistor, wherein the second NMOS transistor is controlled by a second logic circuit providing a second control signal to a gate of the second NMOS transistor, the second logic circuit having a third input configured to receive a signal derived from a complementary data signal and a fourth input configured to receive the enable signal, wherein turning on the second NMOS transistor couples the second bitline to ground.

12. The method of clause 11, wherein the enable signal comprises a write multiplexing signal.

13. The method of clauses 11-12, further comprising:
performing a masking operation in which the first bitline and the second bitline are at a floating voltage, including:
in response to a write masking signal, turning off the first PMOS transistor, the second PMOS transistor, the first NMOS transistor, and the second NMOS transistor.

14. The method of clauses 11-13, further comprising:
de-selecting the memory cell according to the enable signal, including turning off the first NMOS transistor, the second NMOS transistor, a third PMOS transistor coupled in series with the first PMOS transistor, and a fourth PMOS transistor coupled in series with the second PMOS transistor.

15. The method of clauses 11-14, wherein turning on the first PMOS transistor comprises applying the second control signal to a gate of the first PMOS transistor through an inverting logic circuit.

16. The method of clauses 11-15, wherein turning off the second PMOS transistor comprises applying the first control signal to a gate of the second PMOS transistor through an inverting logic circuit.

17. The method of clauses 11-16, wherein turning on the first PMOS transistor comprises applying the signal derived from the complementary data signal to a gate of the first PMOS transistor.

18. The method of clauses 11-17, wherein turning off the second PMOS transistor comprises applying the signal derived from the data signal to a gate of the second PMOS transistor.

19. The method of clauses 11-18, wherein the signal derived from the data signal is further derived from a write masking signal, and wherein the signal derived from the complementary data signal is further derived from the write masking signal.

20. An apparatus, comprising:
a memory array having a plurality of memory cells arranged in a plurality of columns; and
a plurality of write driver circuits coupled to the plurality of columns, wherein a first one of the write driver circuits comprises:
a first bitline and a second bitline coupled to a first one of the columns;
a first NMOS transistor coupled in series with a first PMOS transistor, the first NMOS transistor being coupled to ground, and the first PMOS transistor being coupled to a power supply (VDD), wherein the first bitline is coupled to both the first NMOS transistor and the first PMOS transistor;
a first logic circuit configured to provide a first control signal to a gate of the first NMOS transistor, the first logic circuit having a first input configured to receive a signal derived from a data signal and a second input configured to receive an enable signal;
a second NMOS transistor coupled in series with a second PMOS transistor, the second NMOS transistor being coupled to ground, and the second PMOS transistor being coupled to the VDD, wherein the second bitline is coupled to both the second NMOS transistor and the second PMOS transistor; and
a second logic circuit configured to provide a second control signal to a gate of the second NMOS transistor, the second logic circuit having a third input configured to receive a signal derived from a complementary data signal and a fourth input configured to receive the enable signal.

21. The apparatus of clause 20, further comprising a controller and a column decoder, wherein the controller is configured to cause the column decoder to generate the enable signal.

22. The apparatus of clause 21, wherein the enable signal comprises a write multiplexing signal.

23. The apparatus of clauses 20-22, wherein the first control signal is applied to the second PMOS transistor through a first inverting logic circuit, and wherein the second control signal is applied to the first PMOS transistor through a second inverting logic circuit.

24. The apparatus of clauses 20-22, wherein the first PMOS transistor is coupled to the signal derived from the complementary data signal, and wherein the second PMOS transistor is coupled to the signal derived from the data signal.

25. The apparatus of clause 24, further comprising:
a third PMOS transistor coupled in series with the first PMOS transistor; and
a fourth PMOS transistor coupled in series with the second PMOS transistor, wherein the third PMOS transistor is gate-coupled to a write multiplexing signal, and wherein the fourth PMOS transistor is gate-coupled to the write multiplexing signal.

26. A system on chip (SOC) comprising:
a memory array having a plurality of memory cells arranged in a plurality of columns; and
a plurality of write driver circuits coupled to the plurality of columns, wherein a first one of the write driver circuits comprises:
a first bitline and a second bitline coupled to a first one of the columns;
a first NMOS transistor coupled in series with a first PMOS transistor, the first NMOS transistor being coupled to ground, and the first PMOS transistor being coupled to a power supply (VDD), wherein the first bitline is coupled to both the first NMOS transistor and the first PMOS transistor;
means for providing a first control signal to a gate of the first NMOS transistor according to a signal derived from a data signal and an enable signal;
a second NMOS transistor coupled in series with a second PMOS transistor, the second NMOS transistor being coupled to ground, and the second PMOS transistor being coupled to the VDD, wherein the second bitline is coupled to both the second NMOS transistor and the second PMOS transistor; and
means for providing a second control signal to a gate of the second NMOS transistor according to a signal derived from a complementary data signal and the enable signal.

27. The SOC of clause 26, wherein the means for providing the first control signal comprises a first NOR gate, and wherein the means for providing a second control signal comprises a second NOR gate.

28. The SOC of clauses 26-27, wherein the means for providing the first control signal and the means for providing a second control signal comprise static complementary metal oxide semiconductor (CMOS) circuits.

29. The SOC of clauses 26-28, wherein the signal derived from the data signal is further derived from a third control signal, and wherein the signal derived from the complementary data signal is further derived from the third control signal.

30. The SOC of clause 29, wherein the means for providing a first control signal and the means for providing a second control signal are configured to cause the first bitline and the second bitline to float according to the third control signal.

What is claimed is:

1. A method of operating a semiconductor device, the method comprising:
writing a bit to a memory cell, including:
turning on a first PMOS transistor, wherein the first PMOS transistor is coupled in series with a first NMOS transistor, wherein turning on the first PMOS transistor couples a first bitline to a voltage level of a power supply (VDD);
turning off the first NMOS transistor, wherein the first NMOS transistor is controlled by a first logic circuit providing a first control signal to a gate of the first NMOS transistor, the first logic circuit having a first input configured to receive a signal derived from a data signal and a second input configured to receive an enable signal, wherein turning off the first NMOS transistor isolates the first bitline from ground;
turning off a second PMOS transistor that is coupled in series with a second NMOS transistor, including isolating a second bitline from VDD; and
turning on the second NMOS transistor, wherein the second NMOS transistor is controlled by a second logic circuit providing a second control signal to a gate of the second NMOS transistor, the second logic circuit having a third input configured to receive a signal derived from a complementary data signal and a fourth input configured to receive the enable signal, wherein turning on the second NMOS transistor couples the second bitline to ground,
wherein turning on the first PMOS transistor comprises applying the second control signal to a gate of the first PMOS transistor through an inverting logic circuit.

2. The method of claim 1, wherein the enable signal comprises a write multiplexing signal.

3. The method of claim 1, further comprising:
performing a masking operation in which the first bitline and the second bitline are at a floating voltage, including:
in response to a write masking signal, turning off the first PMOS transistor, the second PMOS transistor, the first NMOS transistor, and the second NMOS transistor.

4. The method of claim 1, further comprising:
de-selecting the memory cell according to the enable signal, including turning off the first NMOS transistor, the second NMOS transistor, a third PMOS transistor coupled in series with the first PMOS transistor, and a fourth PMOS transistor coupled in series with the second PMOS transistor.

5. The method of claim 1, wherein turning off the second PMOS transistor comprises applying the first control signal to a gate of the second PMOS transistor through another inverting logic circuit.

6. The method of claim 1, wherein the signal derived from the data signal is further derived from a write masking signal, and wherein the signal derived from the complementary data signal is further derived from the write masking signal.

7. A static random-access memory (SRAM) write circuit comprising:
a first NMOS transistor coupled in series with a first PMOS transistor, the first NMOS transistor being coupled to ground, and the first PMOS transistor being coupled to a power supply (VDD);
a second NMOS transistor coupled in series with a second PMOS transistor, the second NMOS transistor being coupled to ground, and the second PMOS transistor being coupled to the VDD;
a first bitline coupled to a first node between the first NMOS transistor and the first PMOS transistor;
a second bitline coupled to a second node between the second NMOS transistor and the second PMOS transistor;
a first logic circuit configured to provide a first control signal to a gate of the first NMOS transistor, the first logic circuit having a first input configured to receive a signal derived from a data signal and a second input configured to receive a write enable signal; and
a second logic circuit configured to provide a second control signal to a gate of the second NMOS transistor, the second logic circuit having a third input configured to receive a signal derived from a complementary data signal and a fourth input configured to receive the write enable signal,
wherein the first control signal is applied to the second PMOS transistor through a first inverting logic circuit, and wherein the second control signal is applied to the first PMOS transistor through a second inverting logic circuit.

8. The SRAM write circuit of claim 7, wherein the first logic circuit comprises a NOR gate.

9. The SRAM write circuit of claim 7, wherein the first logic circuit and the second logic circuit are static complementary metal oxide semiconductor (CMOS) circuits.

10. The SRAM write circuit of claim 7, wherein the signal derived from the data signal is further derived from a third control signal, and wherein the signal derived from the complementary data signal is further derived from the third control signal.

11. The SRAM write circuit of claim 10, wherein the first logic circuit and the second logic circuit are configured to turn off the first PMOS transistor, the second PMOS transistor, the first NMOS transistor, and the second NMOS transistor according to the third control signal.

12. The SRAM write circuit of claim 7, wherein:
the first control signal and the second control signal are complimentary when the write enable signal is high; and
the first control signal and the second control signal are both low when the write enable signal is low.

13. The SRAM write circuit of claim 7, wherein the write enable signal is a write multiplexing signal.

14. An apparatus, comprising:
a memory array having a plurality of memory cells arranged in a plurality of columns; and
a plurality of write driver circuits coupled to the plurality of columns, wherein a first one of the write driver circuits comprises:
a first bitline and a second bitline coupled to a first one of the columns;
a first NMOS transistor coupled in series with a first PMOS transistor, the first NMOS transistor being coupled to ground, and the first PMOS transistor being coupled to a power supply (VDD), wherein the first bitline is coupled to both the first NMOS transistor and the first PMOS transistor;
a first logic circuit configured to provide a first control signal to a gate of the first NMOS transistor, the first logic circuit having a first input configured to receive a signal derived from a data signal and a second input configured to receive an enable signal;
a second NMOS transistor coupled in series with a second PMOS transistor, the second NMOS transistor being coupled to ground, and the second PMOS transistor being coupled to the VDD, wherein the second bitline is coupled to both the second NMOS transistor and the second PMOS transistor; and
a second logic circuit configured to provide a second control signal to a gate of the second NMOS transistor, the second logic circuit having a third input configured to receive a signal derived from a complementary data signal and a fourth input configured to receive the enable signal,
wherein the first control signal is applied to the second PMOS transistor through a first inverting logic circuit, and wherein the second control signal is applied to the first PMOS transistor through a second inverting logic circuit.

15. The apparatus of claim 14, further comprising a controller and a column decoder, wherein the controller is configured to cause the column decoder to generate the enable signal.

16. The apparatus of claim 15, wherein the enable signal comprises a write multiplexing signal.

17. A system on chip (SOC) comprising:
a memory array having a plurality of memory cells arranged in a plurality of columns; and
a plurality of write driver circuits coupled to the plurality of columns, wherein a first one of the write driver circuits comprises:
a first bitline and a second bitline coupled to a first one of the columns;
a first NMOS transistor coupled in series with a first PMOS transistor, the first NMOS transistor being coupled to ground, and the first PMOS transistor being coupled to a power supply (VDD), wherein the first bitline is coupled to both the first NMOS transistor and the first PMOS transistor;
means for providing a first control signal to a gate of the first NMOS transistor according to a signal derived from a data signal and an enable signal;
a second NMOS transistor coupled in series with a second PMOS transistor, the second NMOS transistor being coupled to ground, and the second PMOS transistor being coupled to the VDD, wherein the second bitline is coupled to both the second NMOS transistor and the second PMOS transistor; and
means for providing a second control signal to a gate of the second NMOS transistor according to a signal derived from a complementary data signal and the enable signal,
the first control signal is applied to the second PMOS transistor through a first inverting logic circuit, and wherein the second control signal is applied to the first PMOS transistor through a second inverting logic circuit.

18. The SOC of claim 17, wherein the means for providing the first control signal comprises a first NOR gate, and wherein the means for providing h second control signal comprises a second NOR gate.

19. The SOC of claim 17, wherein the means for providing the first control signal and the means for providing h second control signal comprise static complementary metal oxide semiconductor (CMOS) circuits.

20. The SOC of claim 17, wherein the signal derived from the data signal is further derived from a third control signal, and wherein the signal derived from the complementary data signal is further derived from the third control signal.

21. The SOC of claim 20, wherein the means for providing h first control signal and the means for providing h second control signal are configured to cause the first bitline and the second bitline to float according to the third control signal.

* * * * *